United States Patent
Lee et al.

(10) Patent No.: US 11,764,090 B2
(45) Date of Patent: Sep. 19, 2023

(54) TRAY

(71) Applicant: CHIPBOND TECHNOLOGY CORPORATION, Hsinchu (TW)

(72) Inventors: Hsu-Chi Lee, Hsinchu (TW); Pi-Yu Peng, Hsinchu County (TW); Chun-Te Lee, Hsinchu County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/690,121

(22) Filed: Mar. 9, 2022

(65) Prior Publication Data

US 2022/0328334 A1    Oct. 13, 2022

(30) Foreign Application Priority Data

Apr. 12, 2021  (TW) .................................. 110113072

(51) Int. Cl.
    *H01L 21/673*  (2006.01)
(52) U.S. Cl.
    CPC .............................. *H01L 21/67333* (2013.01)
(58) Field of Classification Search
    CPC .............. B65D 85/48; H05K 13/0061; H05K 13/0069; H01L 21/67333; A45C 11/00
    USPC .................................................. 206/706, 710
    See application file for complete search history.

(56) References Cited

U.S. PATENT DOCUMENTS

| 5,918,746 A * | 7/1999 | Tokita | H01L 21/568 206/706 |
| 8,917,519 B2 * | 12/2014 | Sano | H05K 5/0221 206/706 |
| 2005/0189253 A1 * | 9/2005 | Huang | B65D 85/48 206/454 |

(Continued)

FOREIGN PATENT DOCUMENTS

| JP | 62-199027 A | 9/1987 |
| JP | 2-79284 U | 6/1990 |

(Continued)

OTHER PUBLICATIONS

Taiwanese Office Action dated Sep. 7, 2021 for Taiwanese Patent Application No. 110113072, 3 pages.
Japanese Notice of Allowance dated Mar. 24, 2023 for Japanese Patent Application No. 2022-036215, 3 pages.

*Primary Examiner* — Rafael A Ortiz
(74) *Attorney, Agent, or Firm* — Demian K. Jackson; Jackson IPG PLLC

(57) ABSTRACT

A tray includes a body for placement of a component (e.g. electronic component) and a taker disposed on a bottom surface of the body. The taker is used to take a spacer and includes a first taking element and a second taking element. The first taking element includes a first connection portion and a first confinement portion, and the second taking element includes a second connection portion and a second confinement portion. An accommodation space is provided between the first and second connection portions and a passageway is provided between the first and second con- (Continued)

finement portions. While the spacer is moved through the passageway and into the accommodation space, it is confined in the accommodation space by the first and second confinement portions such that the taker can take away the spacer to show another tray located under the spacer as the tray is removed.

11 Claims, 10 Drawing Sheets

(56) References Cited

U.S. PATENT DOCUMENTS

| | | | |
|---|---|---|---|
| 2014/0076765 A1* | 3/2014 | Kuo | B65D 85/48 |
| | | | 206/522 |
| 2014/0083901 A1* | 3/2014 | Hu | B65D 57/006 |
| | | | 206/701 |
| 2020/0198077 A1* | 6/2020 | Andujo | B21D 43/105 |
| 2021/0188516 A1* | 6/2021 | Rochford | B32B 7/12 |

FOREIGN PATENT DOCUMENTS

| | | | |
|---|---|---|---|
| JP | 5-338682 A | | 12/1993 |
| JP | 2010-120689 A | | 6/2010 |
| KR | 20180113073 A | * | 10/2018 |
| TW | 201124728 A | | 7/2011 |
| TW | 201408569 A | | 3/2014 |
| TW | 202021029 A | | 6/2020 |

* cited by examiner

TRAY

FIELD OF THE INVENTION

This invention relates to a tray, and more particularly to a tray able to take a spacer.

BACKGROUND OF THE INVENTION

Conventionally, trays able to be stacked vertically are provided for placement of electronic components such as semiconductor packages or chips. In order to prevent the bottom of an upper tray from colliding with the electronic component placed on a bottom tray located under the upper tray, a Tyvek® paper is usually placed between the upper and bottom trays to protect the electronic component placed on the bottom tray.

If it is required to take the electronic component placed on the bottom tray, the upper tray stacked on the bottom tray needs to be removed, and then the Tyvek® paper covering the bottom tray also needs to be removed. The electronic component placed on the bottom tray is visible after removing the upper tray and the Tyvek® paper respectively, so the production efficiency is low. In addition, the electronic component placed on the bottom tray may be dropped to be damaged while the Tyvek® paper is removed improperly.

SUMMARY

One object of the present invention is to take a spacer under a tray using a taker of the tray such that the tray and the spacer can be removed simultaneously.

A tray of the present invention includes a body and a taker. The body has an upper surface and a bottom surface, at least one component can be placed on the upper surface. The taker is located on the bottom surface of the body and used to take a spacer. The taker includes a first taking element and a second taking element. The first taking element includes a first connection portion connected to the bottom surface and a first confinement portion. The second taking element includes a second connection portion connected to the bottom surface and a second confinement portion. An accommodation space having a first width is provided between the first and second connection portions, a passageway having a second width is provided between the first and second confinement portions and is communicating with the accommodation space. The second width of the passageway is less than the first width of the accommodation space such that the spacer can be confined in the accommodation space as it is moved through the passageway.

Another tray of the present invention includes a body and a taker. The body has an upper surface and a bottom surface, and at least one component can be placed on the upper surface. The taker includes a connection portion and a confinement portion, the connection portion is connected to the bottom surface and the confinement portion is protruded on a surface of the connection portion. The confinement portion is used to confine a spacer to allow the spacer to be moved with the tray.

In the present invention, the taker disposed on the bottom surface of the body is used to take the spacer under the tray and confine the spacer moved through the passageway in the accommodation space. The spacer can be simultaneously removed with the tray to allow another tray located under the spacer to be visible, thus production efficiency can be improved.

DETAILED DESCRIPTION OF THE INVENTION

Figure 1:
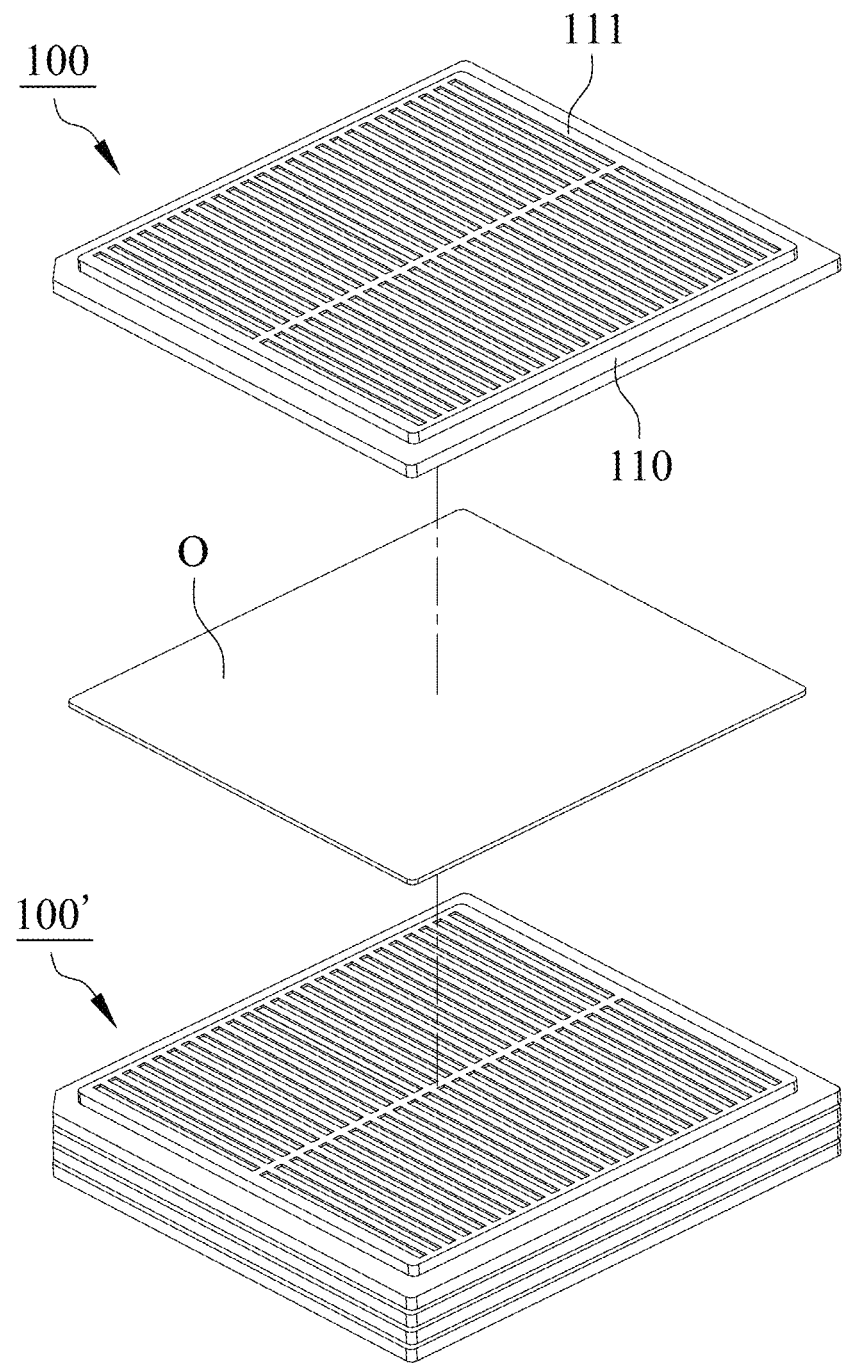
FIG. 1 is a perspective diagram illustrating trays and a spacer in accordance with one embodiment of the present invention.

With reference to FIGS. 1 to 4, a tray 100 of the present invention includes a body 110 and a taker 120. The body 110 has an upper surface 111 and a bottom surface 112, and the upper surface 111 is provided for the placement of at least one component (not shown) which is, but not limit to, a semiconductor package or a chip.

With reference to FIGS. 1 to 8, the taker 120 is disposed on the bottom surface 112 of the body 110 and used to grab a spacer O. The spacer O has a width D and is, but not limit to, Tyvek® paper.

With reference to FIGS. 1 to 4, the taker 120 of the present invention includes at least one taking element, and in this embodiment, the taker 120 includes a first taking element 121 and a second taking element 122. The first taking element 121 includes a first connection portion 121a and a first confinement portion 121b, the first connection portion 121a is connected to the bottom surface 112 of the body 110, the first confinement portion 121b is protruded on a first surface 121c of the first connection portion 121a.

Figure 2:
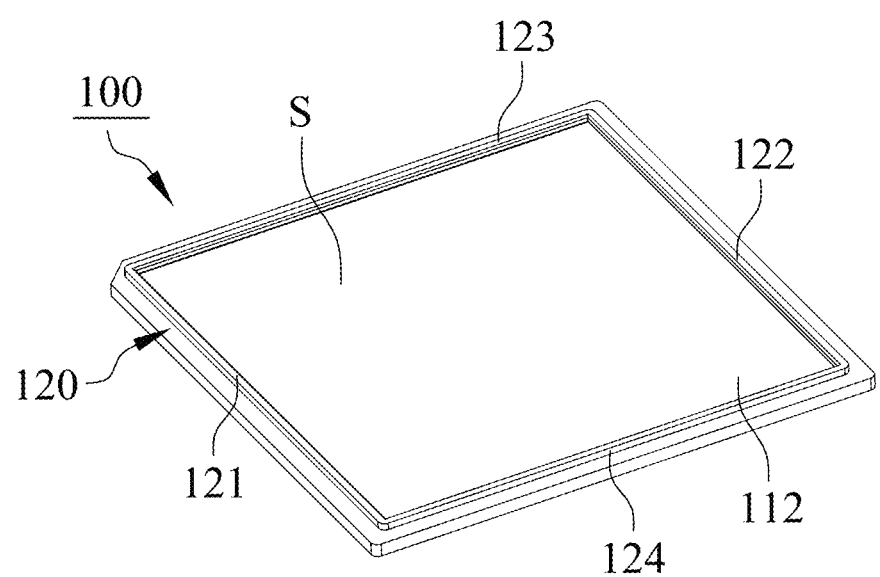
FIG. 2 is a perspective diagram illustrating a bottom of a tray in accordance with one embodiment of the present invention.
Figure 3:
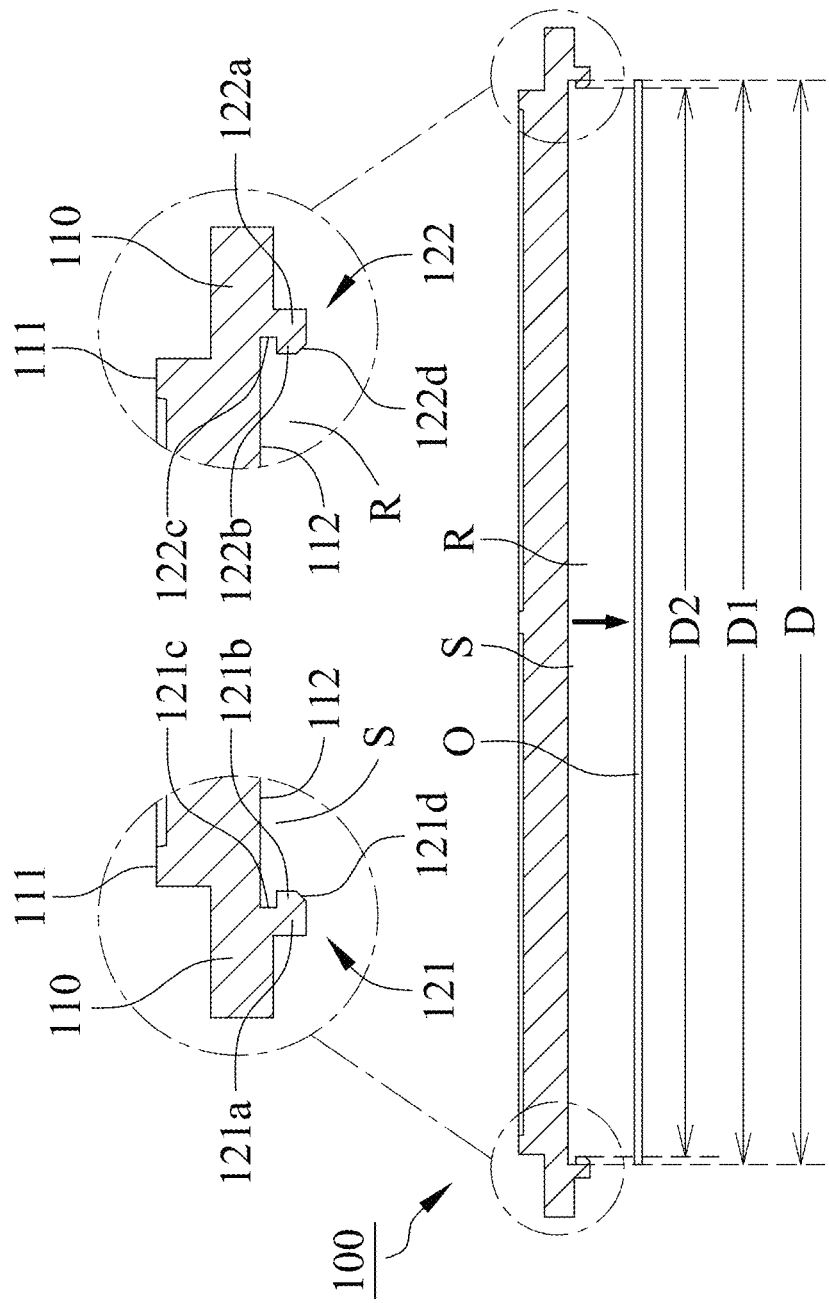
FIG. 3 is a cross-section view diagram illustrating a tray in accordance with one embodiment of the present invention.

With reference to FIGS. 2 and 3, the second taking element 122 includes a second connection portion 122a and a second confinement portion 122b, and the second connection portion 122a is connected to the bottom surface 112 of the body 110. In this embodiment, the first taking element 121 and the second taking element 122 are disposed on two opposite sides of the bottom surface 112. The first surface 121c of the first taking element 121 is facing toward a second surface 122c of the second taking element 122, and the second confinement portion 122b is protruded on the second surface 122c of the second taking element 122.

With reference to FIGS. 2 and 3, an accommodation space S is provided between the first connection portion 121a and the second connection portion 122a, and a passageway R is provided between the first confinement portion 121b and the second confinement portion 122b and it is communicating with the accommodation space S. The width of the accommodation space S is defined as a first width D1, and the width of the passageway R is defined as a second width D2. The second width D2 is less than the first width D1, and the width D of the spacer O is greater than the second width D2.

Preferably, a first guide bevel 121*d* is provided on the first confinement portion 121*b*, and a second guide bevel 122*d* is provided on the second confinement portion 122*b*. The first guide bevel 121*d* and the second guide bevel 122*d* are used for guiding the spacer O to move through the passageway R and into the accommodation space S, and the first confinement portion 121*b* and the second confinement portion 122*b* are used to confine the spacer O in the accommodation space S, thus the space O can be moved with the tray 100.

FIGS. 1 and 5 to 7 are drawings showing how to take away the spacer O placed on another tray 100' using the tray 100 to allow the another tray 100' to be visible.

Figure 5:
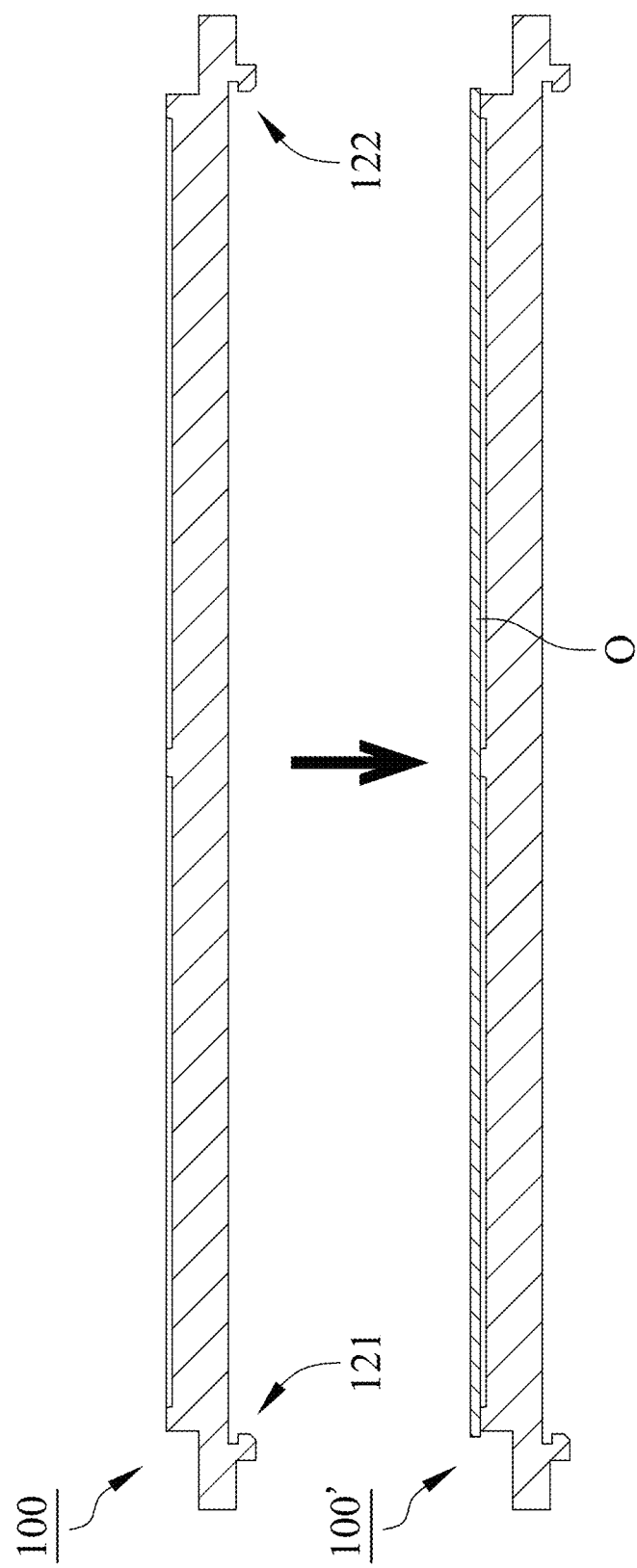
FIGS. 5 to 8 are cross-section view diagrams illustrating how to take a spacer using a tray in accordance with one embodiment of the present invention.
Figure 6:
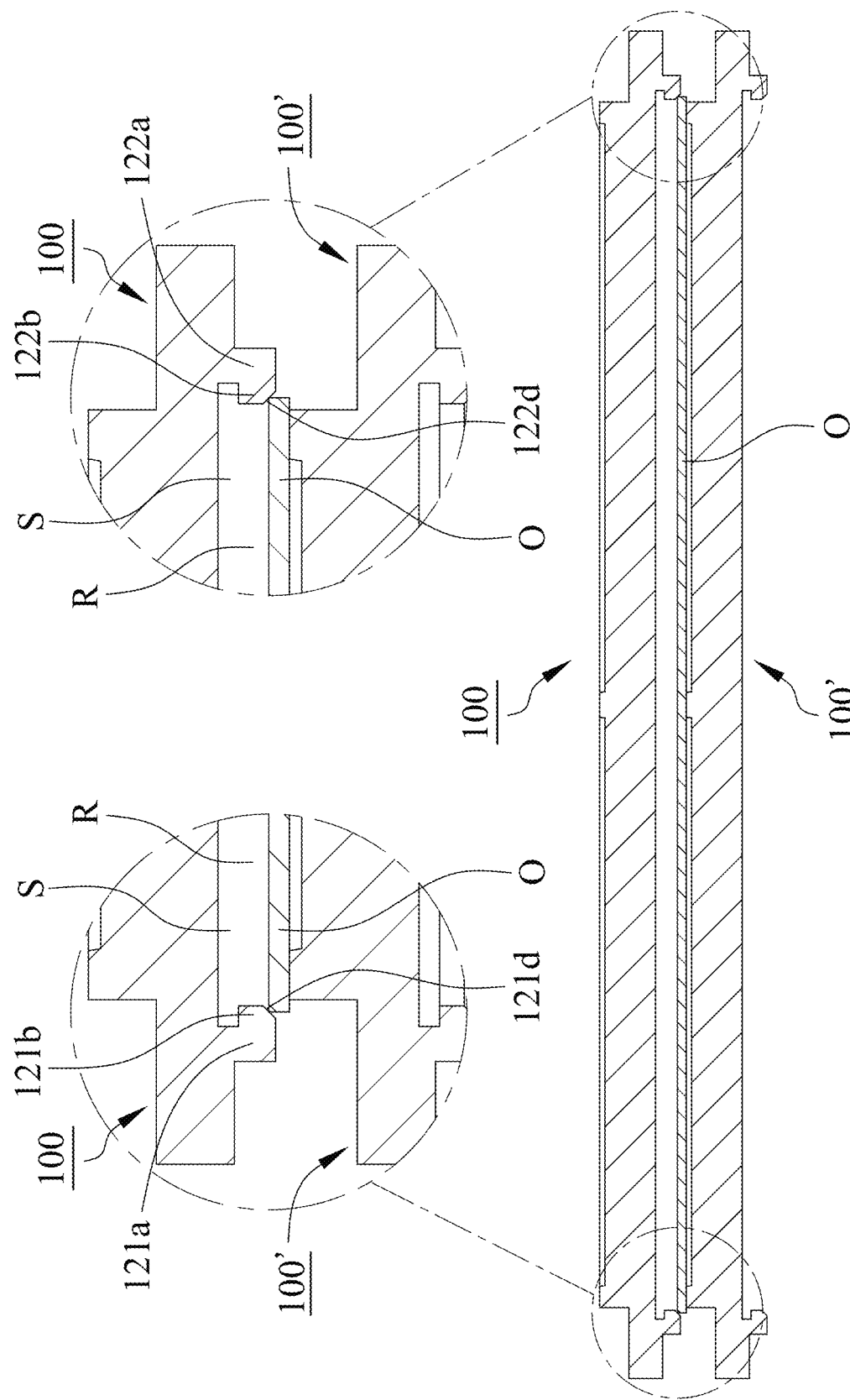
Figure 7:
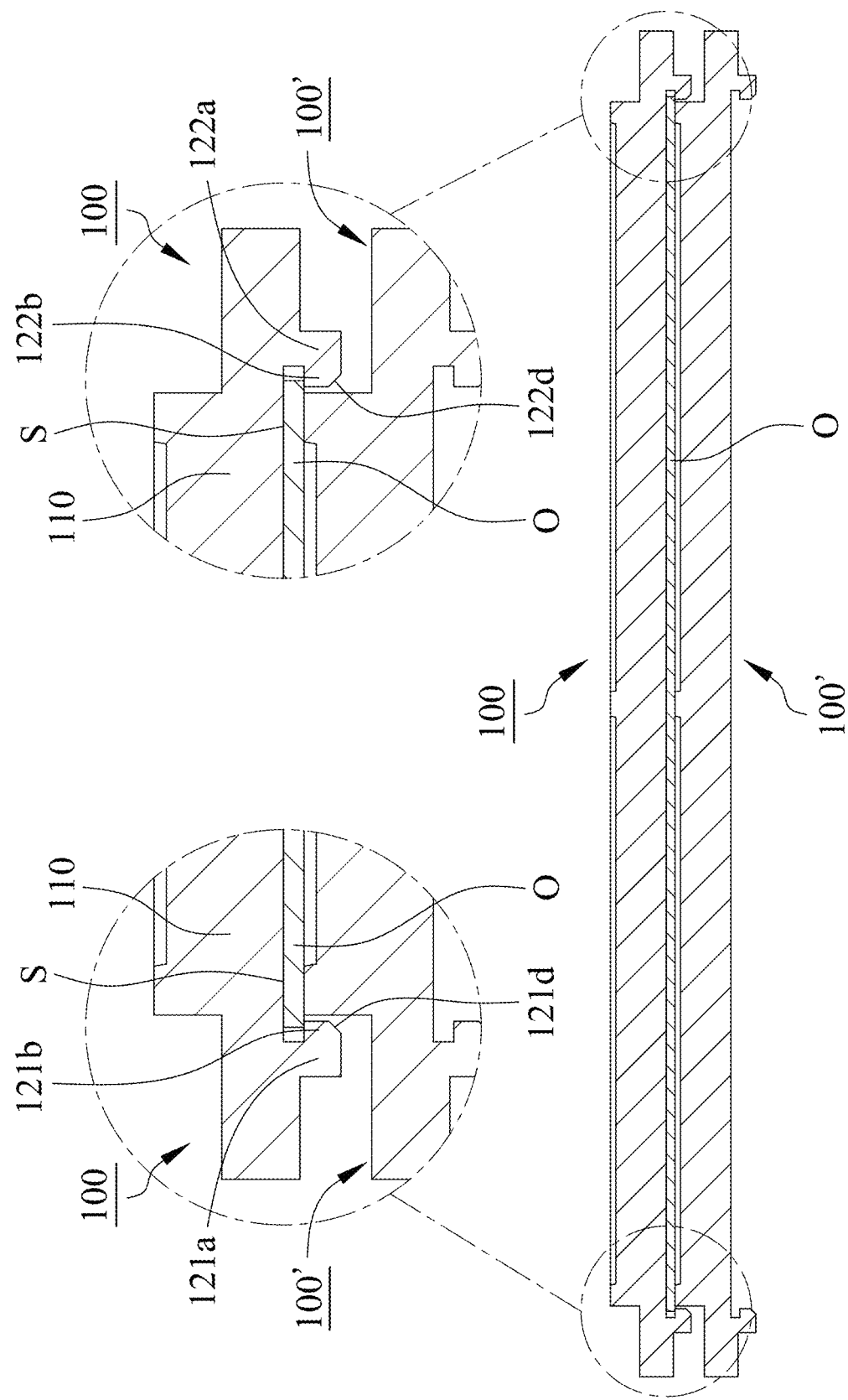

The spacer O is placed on the another tray 100' in advance as shown in FIGS. 1 and 5, and then, while the tray 100 is placed on the bottom tray 100' as shown in FIGS. 6 and 7, the spacer O is contacted with the first confinement portion 121*b* and the second confinement portion 122*b*. In this embodiment, the spacer O is contacted with and guided by the first guide bevel 121*d* of the first confinement portion 121*b* and the second guide bevel 122*d* of the second confinement portion 122*b* so as to be moved through the passageway R and then into the accommodation space S. With reference to FIGS. 3 and 7, owing to the second width D2 of the passageway R is less than the first width D1 of the accommodation space S and the width D of the spacer O is greater than the second width D2 of the passageway R, the spacer O is confined in the accommodation space S by the first confinement portion 121*b* and the second confinement portion 122*b*.

Figure 8:
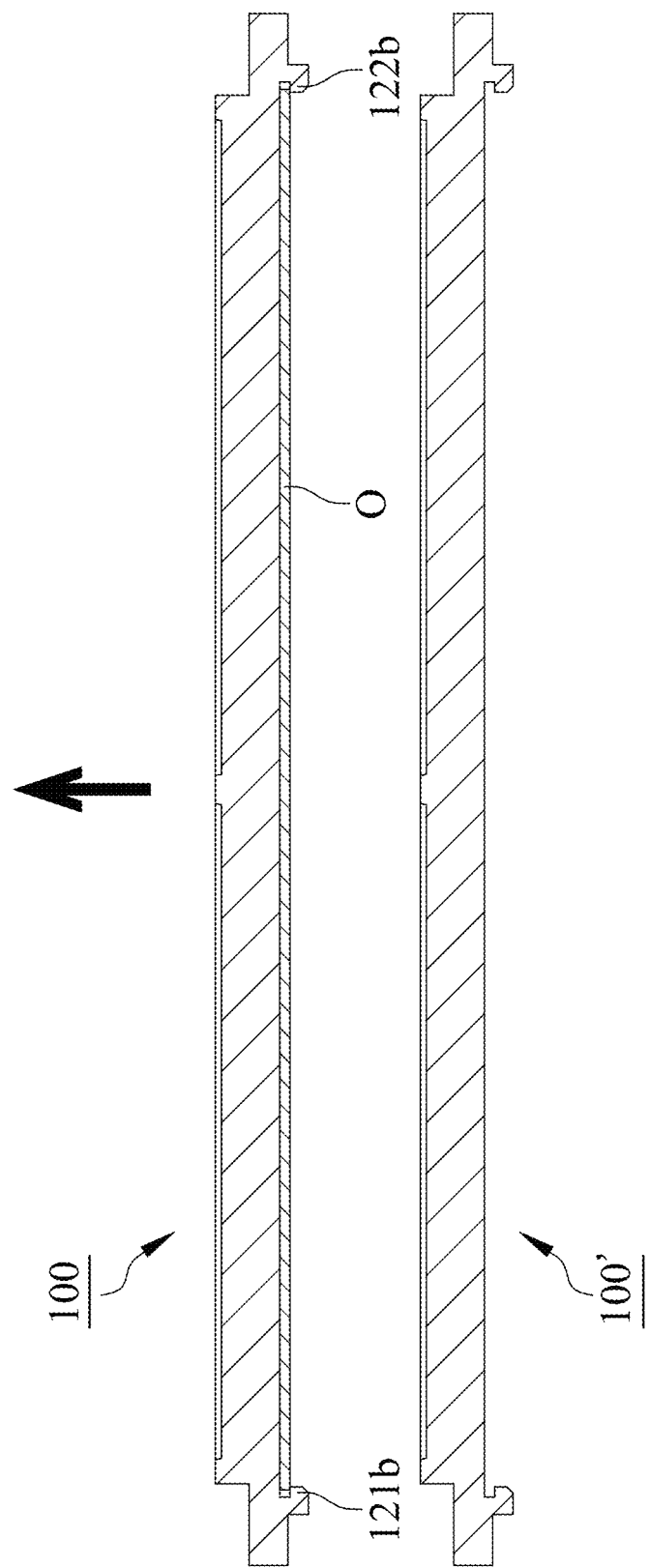

With reference to FIG. 8, as the tray 100 is removed, the spacer O confined in the accommodation space S by the first confinement portion 121*b* and the second confinement portion 122*b* can be moved with the tray 100 to allow the bottom tray 100' to be visible. The tray 100 and the spacer O can be removed simultaneously so it is possible to improve production efficiency.

Figure 9:
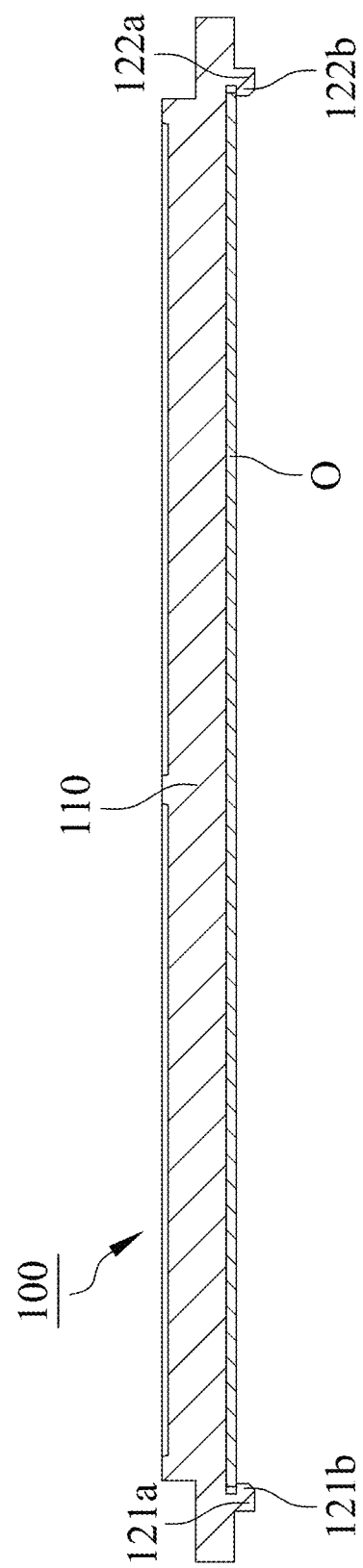
FIG. 9 is a cross-section view diagram illustrating a tray taking a spacer in accordance with another embodiment of the present invention.

With reference to FIG. 9, in another embodiment, the spacer O can be put into the accommodation space S in advance to be confined by the first confinement portion 121*b* and the second confinement portion 122*b*. The spacer O also can be moved with the tray 100 and can be replaced as required.

Figure 4:
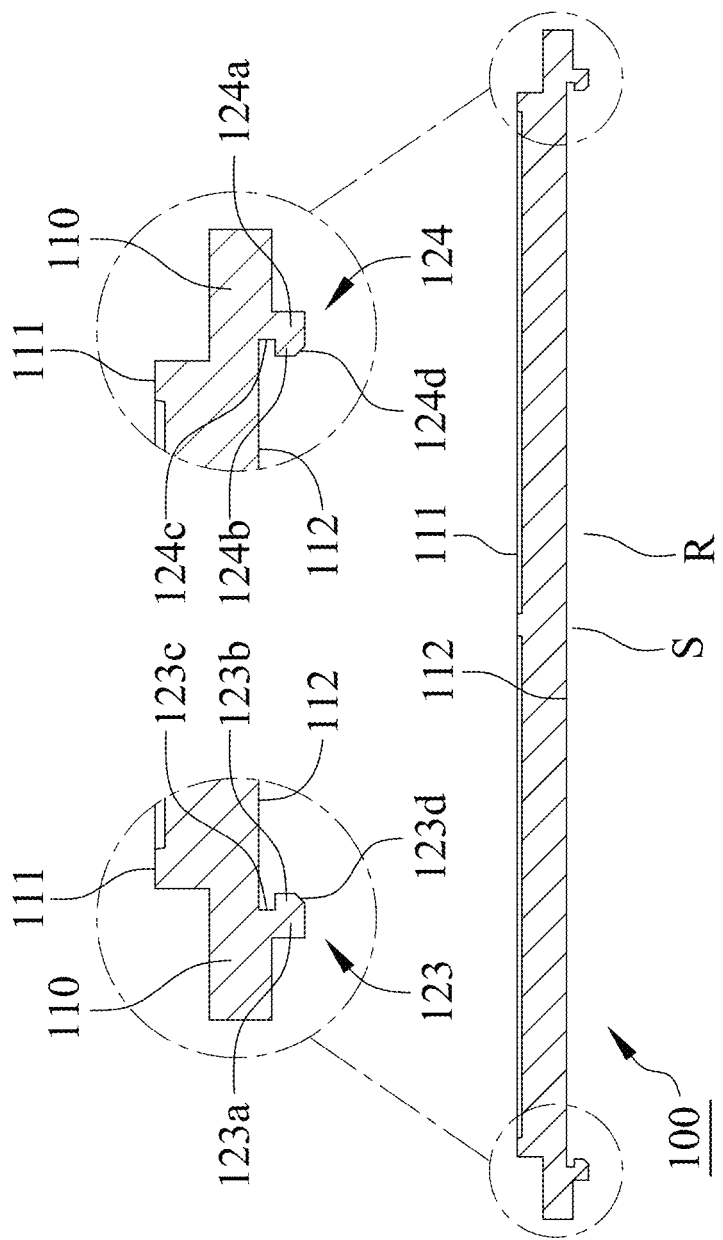
FIG. 4 is a cross-section view diagram illustrating a tray in accordance with one embodiment of the present invention.

With reference to FIGS. 2 and 4, the taker 120 of the tray 100 further includes a third taking element 123 and a fourth taking element 124. The third taking element 123 and the fourth taking element 124 are disposed on two opposite sides of the bottom surface 112 of the body 110 and located outside of the accommodation space S. And the first taking element 121, the second taking element 122, the third taking element 123 and the fourth taking element 124 are located around the accommodation space S. The third taking element 123 includes a third connection portion 123*a* and a third confinement portion 123*b*, the third connection portion 123*a* is connected to the bottom surface 112 of the body 110, the third confinement portion 123*b* is protruded on a third surface 123*c* of the third connection portion 123*a*, and a third guide bevel 123*d* is provided on the third confinement portion 123*b*. The fourth taking element 124 includes a fourth connection portion 124*a* and a fourth confinement portion 124*b*, the fourth connection portion 124*a* is connected to the bottom surface 112 of the body 110, the fourth confinement portion 124*b* is protruded on a fourth surface 124*c* of the fourth connection portion 124*a*, and a fourth guide bevel 124*d* is provided on the fourth confinement portion 124*b*. The third guide bevel 123*d* and the fourth guide bevel 124*d* are used to guide the space O such that the space O can be moved through the passageway R and then into the accommodation space S.

With reference to FIGS. 2 and 4, in this embodiment, both ends of the third taking element 123 are connected to the first taking element 121 and the second taking element 122 respectively, and both ends of the fourth taking element 124 are connected to the first taking element 121 and the second taking element 122 respectively. After the spacer O is moved through the passageway R and into the accommodation space S, the spacer O is confined in the accommodation space S not only by the first confinement portion 121*b* and the second confinement portion 122*b*, but also by the third confinement portion 123*b* and the fourth confinement portion 124*b*.

Figure 10:
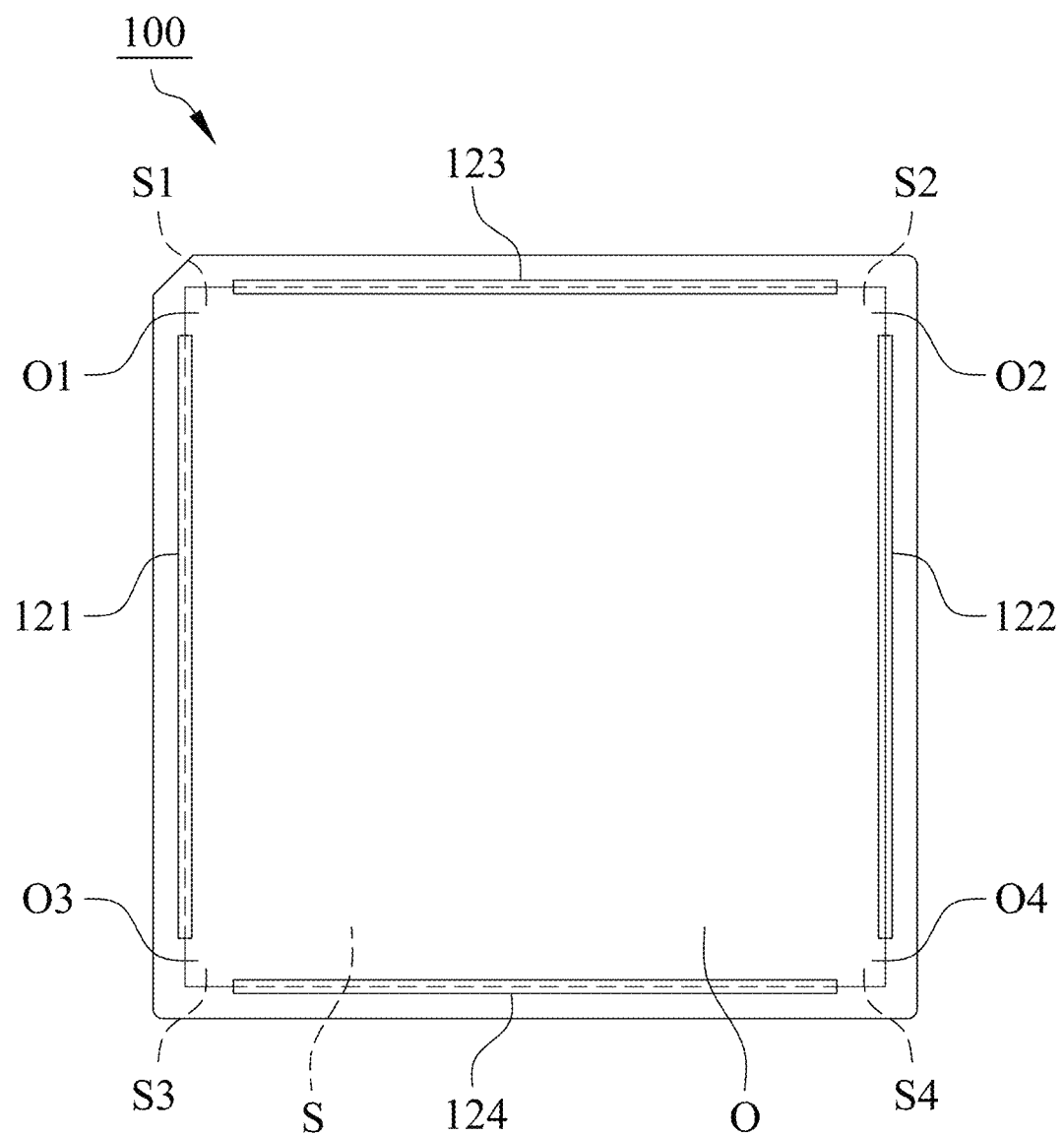
FIG. 10 is a bottom view diagram illustrating a tray in accordance with another embodiment of the present invention.

FIG. 10 shows a tray 100 of another type. Different to the tray 100 as shown in FIG. 2, a first yielding space S1 is provided between the first taking element 121 and the third taking element 123, it is communicating with the accommodation space S and provided for accommodating a first corner O1 of the spacer O. In this embodiment, a second yielding space S2, communicating with the accommodation space S and provided for accommodating a second corner O2 of the spacer O, is further provided between the third taking element 123 and the second taking element 122. Preferably, a third yielding space S3 and a fourth yielding space S3 are further provided on the tray 100 as shown in FIG. 10. The third yielding space S3 is located between the fourth taking element 124 and the first taking element 121, and the fourth yielding space S4 is located between the fourth taking element 124 and the second taking element 122. The third yielding space S3 and the fourth yielding space S4 are communicating with the accommodation space S and used for accommodating a third corner O3 and a fourth corner O4 of the spacer O respectively so as to avoid warpage of the spacer O.

In the present invention, the taker 120 disposed on the bottom surface 112 of the body 110 is provided to take the spacer O located under the tray 100 and confine the spacer O moved through the passageway R in the accommodation space S. Consequently, the bottom tray 100' under the spacer O can be visible after removing the tray 100. Production efficiency improvement is realizable because the tray 100 and the spacer O can be removed together.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A tray comprising:
   a body including an upper surface and a bottom surface, the upper surface is configured for placement of at least one component; and
   a taker disposed on the bottom surface of the body, configured to take a spacer and including a first taking element and a second taking element, the first taking element includes a first connection portion and a first confinement portion, the first connection portion is connected to the bottom surface of the body, the second taking element includes a second connection portion and a second confinement portion, the second connection portion is connected to the bottom surface of the body, an accommodation space having a first width is provided between the first and second connection portions, a passageway having a second width is provided between the first and second confinement portions and is communicating with the accommodation space, the second width of the passageway is less than the first width of the accommodation space such that the spacer moved through the passageway is configured to be confined in the accommodation space and moved together with the tray, and another tray under the spacer is configured to be visible after removing the tray.

2. The tray in accordance with claim 1, wherein a first surface of the first connection portion is facing toward a second surface of the second connection portion, and the first confinement portion is protruded on the first surface of the first connection portion.

3. The tray in accordance with claim 2, wherein the second confinement portion is protruded on the second surface of the second connection portion.

4. The tray in accordance with claim 2, wherein a first guide bevel is provided on the first confinement portion.

5. The tray in accordance with claim 4, wherein a second guide bevel is provided on the second confinement portion.

6. The tray in accordance with claim 1, wherein the taker further includes a third taking element, the third taking element is located outside of the accommodation space and includes a third connection portion and a third confinement portion, the third connection portion is connected to the bottom surface of the body.

7. The tray in accordance with claim 6, wherein one end of the third taking element is connected to the first taking element and the other end of the third taking element is connected to the second taking element.

8. The tray in accordance with claim 6, wherein a first yielding space communicating with the accommodation space is provided between the first and third taking elements and is configured to accommodate a first corner of the spacer.

9. The tray in accordance with claim 8, wherein a second yielding space communicating with the accommodation space is provided between the second and third taking elements and is configured to accommodate a second corner of the spacer.

10. The tray in accordance with claim 6, wherein the third confinement portion is protruded on a third surface of the third connection portion.

11. The tray in accordance with claim 10, wherein a third guide bevel is provided on the third confinement portion.

* * * * *